US012613367B2

(12) United States Patent
Fratalocchi et al.

(10) Patent No.: US 12,613,367 B2
(45) Date of Patent: Apr. 28, 2026

(54) LIGHT PROCESSING DEVICE BASED ON MULTILAYER NANO-ELEMENTS

(71) Applicant: KING ABDULLAH UNIVERSITY OF SCIENCE AND TECHNOLOGY, Thuwal (SA)

(72) Inventors: Andrea Fratalocchi, Thuwal (SA); Fedor Fedorovich Getman, Thuwal (SA); Maksim Makarenko, Thuwal (SA); Arturo Burguete Lopez, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 1183 days.

(21) Appl. No.: 17/422,549

(22) PCT Filed: Dec. 5, 2019

(86) PCT No.: PCT/IB2019/060483
§ 371 (c)(1),
(2) Date: Jul. 13, 2021

(87) PCT Pub. No.: WO2020/157560
PCT Pub. Date: Aug. 6, 2020

(65) Prior Publication Data
US 2022/0091318 A1      Mar. 24, 2022

Related U.S. Application Data

(60) Provisional application No. 62/844,416, filed on May 7, 2019, provisional application No. 62/799,324, filed on Jan. 31, 2019.

(51) Int. Cl.
*G02B 5/30* (2006.01)
*G02B 5/26* (2006.01)
(Continued)

(52) U.S. Cl.
CPC ............ *G02B 5/3041* (2013.01); *G02B 5/26* (2013.01); *G02B 5/3083* (2013.01);
(Continued)

(58) Field of Classification Search
CPC ...... G02B 5/3041; G02B 5/26; G02B 5/3083; G02B 27/0012; G02B 27/283; G02B 27/286; G02B 2207/101; G06F 30/27
(Continued)

(56) References Cited

U.S. PATENT DOCUMENTS

| | | |
|---|---|---|
| 7,221,501 B2 | 5/2007 | Flagello et al. |
| 2004/0169924 A1 | 9/2004 | Flagello et al. |

(Continued)

FOREIGN PATENT DOCUMENTS

| | | |
|---|---|---|
| EP | 2511751 A1 | 10/2012 |
| JP | 2001091701 A | 4/2001 |

(Continued)

OTHER PUBLICATIONS

Decision of Rejection in corresponding/related Japanese Patent Application No. 2021-544920, dated May 29, 2023.
(Continued)

*Primary Examiner* — Bumsuk Won
*Assistant Examiner* — Grant A Gagnon
(74) *Attorney, Agent, or Firm* — PATENT PORTFOLIO BUILDERS PLLC

(57) ABSTRACT

A light processing device includes a first layer having a substrate; and plural nano-elements formed on the substrate. A feature of the plural nano-elements is selected to control a parameter of an input light beam that impinges of the first layer.

19 Claims, 22 Drawing Sheets

(51) Int. Cl.
G02B 27/00 (2006.01)
G02B 27/28 (2006.01)
G06F 30/27 (2020.01)

(52) U.S. Cl.
CPC ....... G02B 27/0012 (2013.01); G02B 27/283 (2013.01); G02B 27/286 (2013.01); G06F 30/27 (2020.01); G02B 2207/101 (2013.01)

(58) Field of Classification Search
USPC ......................................................... 359/485
See application file for complete search history.

(56) References Cited

U.S. PATENT DOCUMENTS

| | | | |
|---|---|---|---|
| 2015/0234197 A1 | 8/2015 | Ushigome | |
| 2015/0323805 A1 | 11/2015 | Bell | |

FOREIGN PATENT DOCUMENTS

| | | | |
|---|---|---|---|
| JP | 2003050455 | A | 2/2003 |
| JP | 2004258670 | A | 9/2004 |
| JP | 2006514751 | A | 5/2006 |
| JP | 2006517307 | A | 7/2006 |
| JP | 2006276116 | A | 10/2006 |
| JP | 2014167550 | A | 9/2014 |
| JP | 2014178717 | A | 9/2014 |
| JP | 2015152835 | A | 8/2015 |
| JP | 2017523479 | A | 8/2017 |
| JP | 2018134051 | A | 8/2018 |
| KR | 1020200025011 | A | 3/2020 |
| WO | 2004072692 | A2 | 8/2004 |
| WO | 2004019070 | A3 | 1/2005 |
| WO | 2015172063 | A1 | 11/2015 |
| WO | 2018126078 | A1 | 7/2018 |
| WO | 2018129385 | A1 | 7/2018 |

OTHER PUBLICATIONS

Substantive Examination Report in corresponding/related Saudi Arabian Application No. 521422666, issued on Sep. 19, 2023.
Reconsideration Report by Examiner before Appeal in corresponding/related Japanese Patent Application No. 2021-544920, dated Dec. 15, 2023.
International Search Report in corresponding/related International Application No. PCT/IB2019/060483, date of mailing Mar. 6, 2020.
Written Opinion of the International Searching Authority in corresponding/related International Application No. PCT/IB2019/060483, date of mailing Mar. 6, 2020.
First Office Action in corresponding/related Japanese Patent Application No. 2021-544920, dated Dec. 5, 2022.
Communication pursuant to Article 94(3) EPC in corresponding/related European Application No. 19821294.6, dated Oct. 25, 2023.
Inampudi, S., et al., "Neural Network Based Design of Metagratings," Applied Physics Letters, Jun. 13, 2018, vol. 112, No. 24, pp. 241102-1-241102-5, AIP Publishing.
Liu, Z., et al., "A Generative Model for Inverse Design of Metamaterials," arxiv.org, Cornell University Library, May 25, 2018, pp. 1-15.
Malkiel, I., et al., "Plasmonic Nanostructure Design and Characterization via Deep Learning," Nature, Light: Science & Applications, Sep. 5, 2018, vol. 7, No. 60, pp. 1-8.
Peurifoy, J., et al., "Nanophotonic Particle Simulation and Inverse Design Using Artificial Neural Networks," Science Advances, Jun. 1, 2018, vol. 4, No. 6, pp. 1-7.
Second Substantive Examination Report in corresponding/related Saudi Arabian Application No. 521422666, issued on Mar. 31, 2024.
Second Office Action in corresponding/related Japanese Patent Application No. 2021-544920, dated Jul. 16, 2024.

200

240i

230

220

210

240-1

212

210

240-4

240-3

240-1

212

240-2

LIGHT PROCESSING DEVICE BASED ON MULTILAYER NANO-ELEMENTS

CROSS-REFERENCE TO RELATED APPLICATIONS

This application is a U.S. National Stage Application of International Application No. PCT/IB2019/060483, filed on Dec. 5, 2019, which claims priority to U.S. Provisional Patent Application No. 62/799,324, filed on Jan. 31, 2019, entitled "FLAT OPTICS POLARIZER BEAM SPLITTER," and U.S. Provisional Patent Application No. 62/844,416, filed on May 7, 2019, entitled "LIGHT PROCESSING DEVICE BASED ON MULTILAYER NANO-ELE-MENTS," the disclosures of which are incorporated herein by reference in their entirety.

BACKGROUND

Technical Field

Embodiments of the subject matter disclosed herein gen-erally relate to a light processing device that alters one or more properties of an incident light beam, and more spe-cifically, to techniques and processes for controlling the one or more properties of the incident light beam with nano-elements distributed over one or more layers.

Discussion of the Background

Polarization components are used in imaging applications to reduce glare or hot spots, enhance contrast, or to perform stress evaluations. Polarization can also be used to measure changes in magnetic fields, temperature, molecular struc-tures, chemical interactions, or acoustic vibrations. Polariz-ers are used to transmit a specific polarization state of an incident light beam while blocking all others. Polarized light can have linear, circular, or elliptical polarization.

A beam-splitting polarizer 100 splits an incident light beam 102 (see FIG. 1) into two beams 104 and 106 of differing linear polarization, the S-polarization and the P-po-larization, respectively. For an ideal polarizing beam splitter, these two beams 104 and 106 would be fully polarized, with orthogonal polarizations (the dots on the beam 104 and the arrows on the beam 106 indicate their polarization). For many common beam-splitting polarizers, however, only one of the two output beams is fully polarized. The other beam may contain a mixture of polarization states.

Polarizing plate beam splitters may be manufactured with narrowband beam splitting coatings 110 deposited on the front surface, and these coatings are designed for various laser wavelengths, as described on Thorlabs (New Jersey, USA) web site (see, for example, www.thorlabs.com). Unlike traditional polarizing beam splitters, which are designed for use at Brewster's angle, these optics are meant to be used at a 45° angle of incidence, which allows for easier mounting. Although the optics can be angle tuned, doing so will result in a degradation of the attainable extinction ratio.

Polarizing beam splitters are designed such that upon incidence of the original light beam 102, the s-polarized light 104 will be reflected at a 45° angle while the p-polar-ized light 106 is transmitted. A ghost beam 112 may also be present and this is due to a reflection inside the beam splitter 100. Therefore, these beam splitters can be thought of as a 45° high reflector with the two reflection bands offset to allow high transmission of the p-polarized component 106 and simultaneous high reflectance of the s-polarized com-ponent 104.

The hard coating 110 deposited onto the surface of these plate beam splitters offers a higher damage threshold than typically obtained with conventional coatings. For applica-tions where high extinction ratio, transmission, or damage threshold is necessary, these optics are the preferred option over Polarizing Beam splitter Cubes.

Conventional polarizer beam splitters, as those illustrated in FIG. 1, are bulky structures of few mm length that work for specific frequencies and that cost around 500 USD. The cost originates from the fact that these structures work by using specific dielectric coatings that are expensive.

Thus, there is a need for a simple, small, and cheap polarizer that achieves the functionality of a traditional polarizers but at a fraction of cost. Also, there is a need for a polarizer that can control more than the polarization of a beam light.

SUMMARY

According to an embodiment, there is a light processing device that includes a first layer having a substrate and plural nano-elements formed on the substrate. A feature of the plural nano-elements is selected to control a parameter of an input light beam that impinges of the first layer.

According to another embodiment, there is a method for configuring a light processing device for processing an input light beam. The method includes a step of receiving char-acteristics of the input light beam, a step of selecting desired values for the characteristics of an output light beam, wherein the output light beam is a result of the input light beam passing through the light processing device, a step of applying a machine learning algorithm to the characteristics of the input light beam and to the desired values of the output light beam to determine a parameter of nano-elements associated with the light processing device, and a step of building the light processing device based on the determined parameter.

According to still another embodiment, there is a light processing device that includes a first layer having a sub-strate and plural nano-elements formed on the substrate, at least two nano-element of the plural nano-elements having a feature that is different from each other. The feature of the plural nano-elements is selected to control a parameter of an input light beam that impinges of the first layer.

BRIEF DESCRIPTION OF THE DRAWINGS

The accompanying drawings, which are incorporated in and constitute a part of the specification, illustrate one or more embodiments and, together with the description, explain these embodiments. In the drawings.

DETAILED DESCRIPTION

The following description of the embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to a light processing unit that includes plural layers having multiple nano-elements. However, the embodiments discussed herein are not limited to a light processing unit that has plural layers of nano-elements, it may include only a single layer of nano-elements or a layer having elements sized to be in the micrometer range.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

According to an embodiment, a light processing device is designed to change at least one characteristic of an incident light beam in a controlled and predictable way. Depending on the desired characteristic of the output light beam, which varies from application to application, various nano-elements are made on one or more layers of the device. The device includes one or more nano-elements, for example, ultrathin amorphous silicon formed on top of a glass substrate. The width, height and the spacing of the nano-elements may be optimized for each light frequency in an input light beam that includes multiple frequencies. When unpolarized light impinges on this device, each polarization is either transmitted or reflected and the beam is split according to its polarization.

The light processing device may be built, in one embodiment, from a silicon material of ultrathin thickness (about 50 nm), which is suitably patterned and it may work on 100 nm bandwidth at any frequency in the visible and near infrared. According to the knowledge of the inventors, there is currently no optical technology developed at this thickness. This device, due to its very small foot print, can be integrated with on-chip applications and wearable components. Furthermore, such a device is much cheaper than the existing polarizers because of the small size and the absence of the expensive coating layers.

Figure 1:
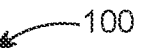
FIG. 1 illustrates a traditional polarizer.
Figure 1:
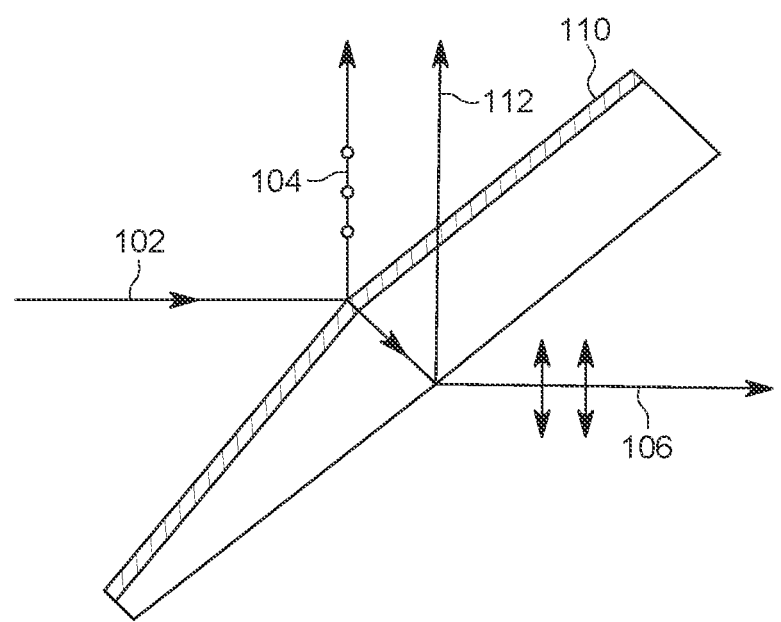
Figure 2:
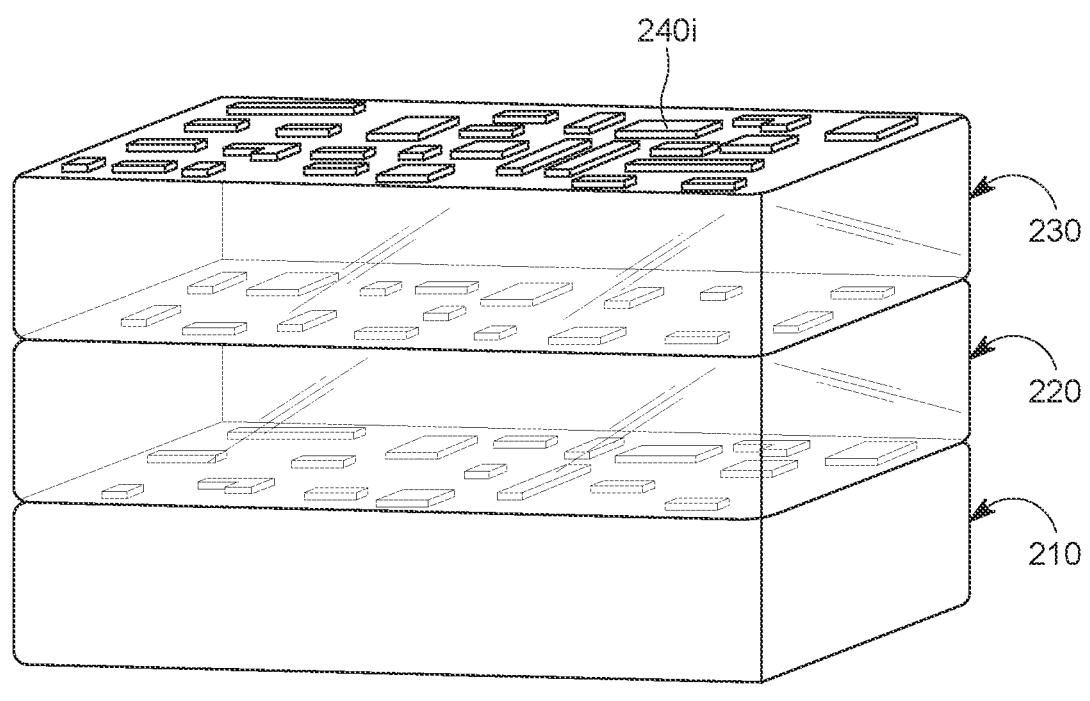
FIG. 2 illustrates a multi-layer light processing device having plural nano-elements for controlling a characteristic of an output light beam.

FIG. 2 shows a light processing device 200 that includes three layers 210, 220, and 230 formed on top of each other. As previously discussed, the light processing device 200 may have any number of layers, e.g., any number between a single layer and tens if not hundreds of layers. Each layer includes one or more nano-elements 240*i*, where "i" can take any value equal to or larger than one. The term "nano-element" is defined herein as a structure that has at least two sides in the nanometer range.

Figure 3A:
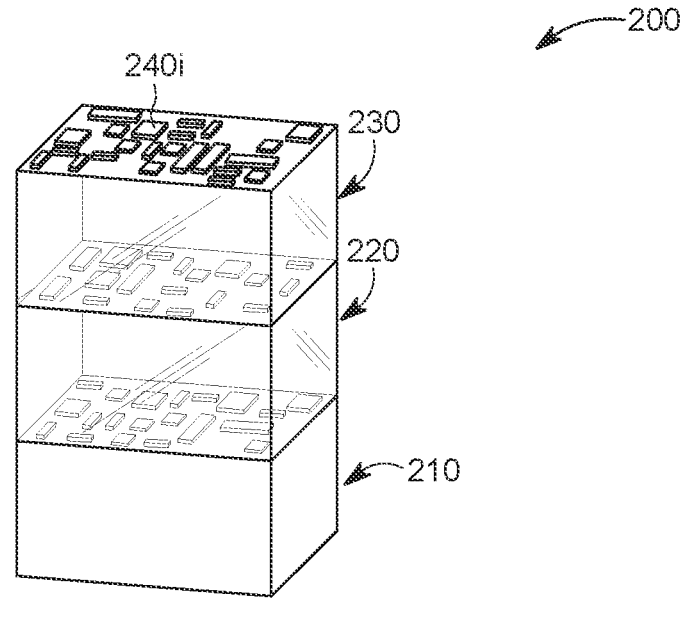
FIGS. 3A to 3C illustrate the multi-layer light processing device, a single layer of this device, and a single nano-element of this layer.
Figure 3B:
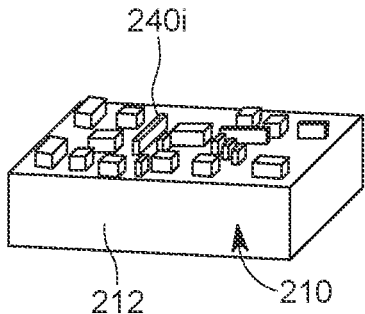
Figure 3C:
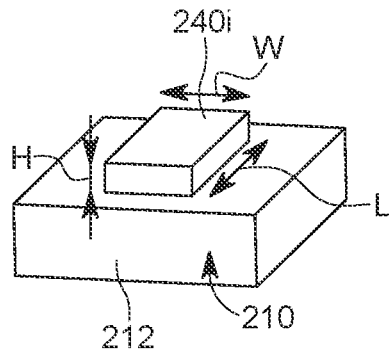

FIG. 3A shows the light processing device while exploded FIGS. 3B and 3C show in more detail the nano-elements 240*i*. Note that FIG. 3B shows many nano-elements being formed on top of a substrate 212, which is part of the layer 210, and FIG. 3C shows a single nano-element 240*i* having a length L, a width W, and a height H. By controlling the size of each nano-element and the location of each nano-element on a corresponding layer, it is possible to control one or more properties of the reflected and transmitted light beams locally, where a property is one of many possible properties, including but not limited to polarization, intensity, amplitude, or phase. In this way, the light processing device 200 can replace the traditional bulky optical components (filters, polarizers, dichroic, lenses), thus being able to produce an ultra-flat structure that can be combined in series for all optical (=ultrafast) image analysis and integrated optical measurements.

The nano-element 240*i* is made of a high refractive index material, for example, n equal to or larger than 3, while the substrate 212 of the layer 210 is made of a low refractive index material, for example, n equal to or smaller than 2. The substrate may be, in one application, glass. The nano-element 240*i* may be made of Si in one application. In one application, each dimension L, W, and H of the nano-element 240*i* is smaller than a couple of wavelengths λ associated with the impinging light beam. In one application, the sides of the nano-element 240*i* are smaller than λ/5. In yet another application, the size of any side of the nano-element is smaller than λ/3. In still another application, the size of any side of the nano-element is smaller than λ/2.

Figure 4A:
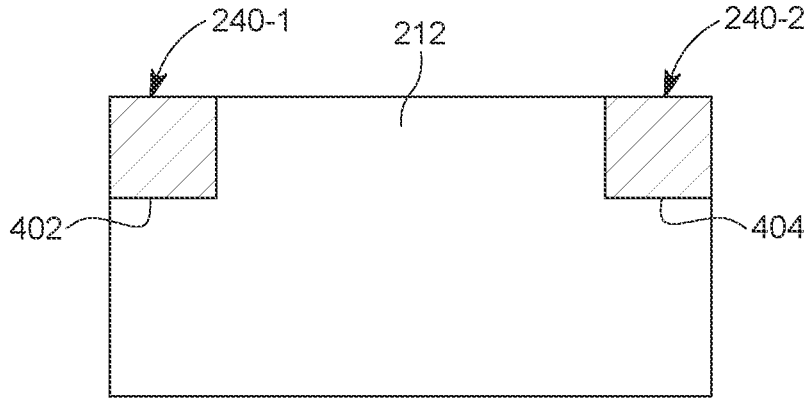
FIGS. 4A and 4B illustrate various ways to form the nano-elements on a substrate.
Figure 4B:
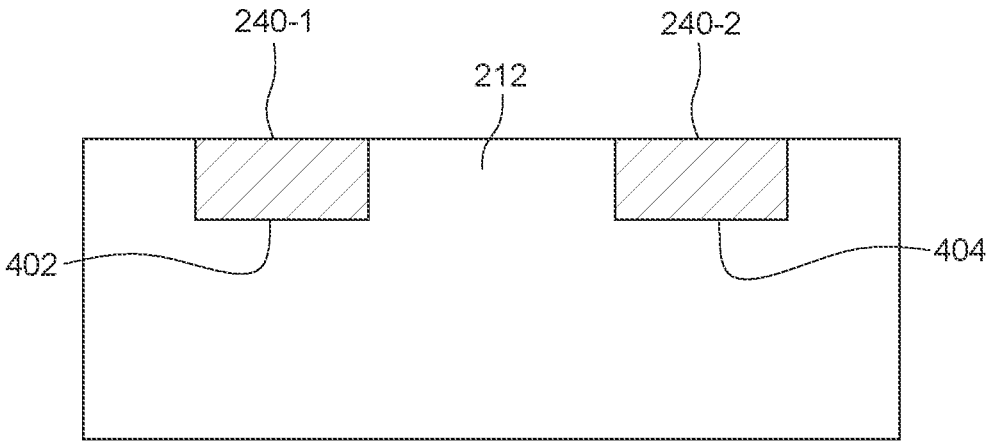

The nano-elements 240*i* may be formed on top of the substrate, as illustrated in FIG. 3C. However, nano-elements 240-1 and 240-2 may also be formed in grooves formed in the substrate 212. For example, FIG. 4A shows two grooves 402 and 404 formed on the sides of the substrate 212 and the nano-elements 240-1 and 240-2 being made in those grooves while FIG. 4B shows two grooves 402 and 404 formed in the body of the substrate 212, away from the sides. Those skilled in the art would understand that it is also possible to combine the nano-elements shown in FIGS. 3C, 4A, and 4B in any conceivable way.

Figure 5:
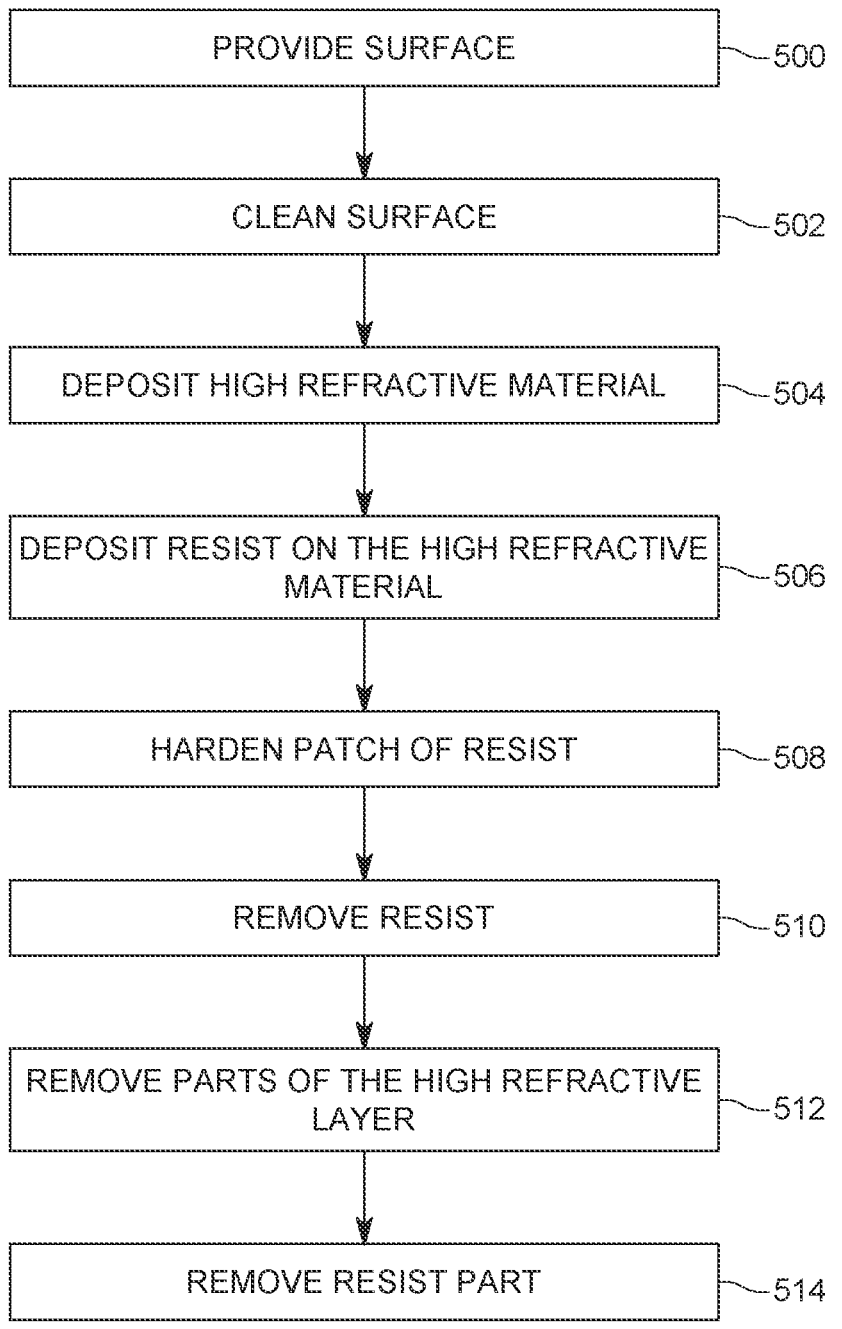
FIG. 5 is a flowchart of a method for making a light processing device that has plural nano-elements.
Figure 6A:
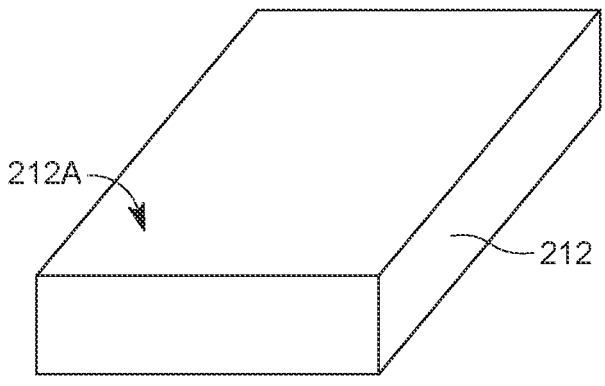
FIGS. 6A to 6H illustrate the various steps of the method for making the light processing device.
Figure 6B:
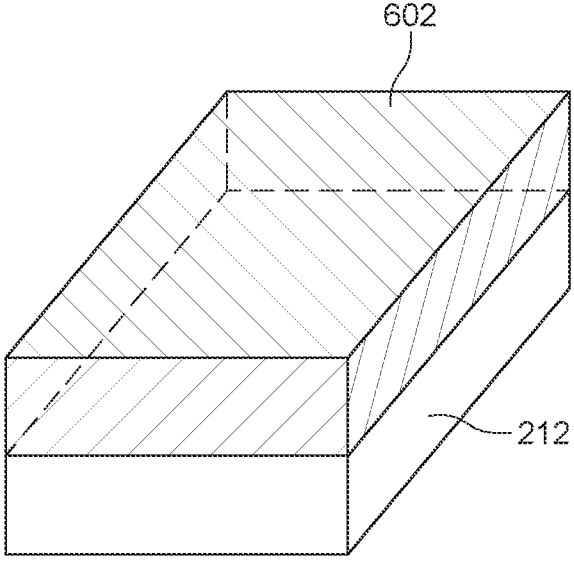

A method for forming the nano-elements 240*i* is now discussed with regard to FIG. 5. In step 500, a substrate 212 is provided as illustrated in FIG. 6A. In step 502, the surface 212A of the substrate 212 is cleaned, for example, with acetone and isopropanol. Other chemicals or methods may be used to clean the surface 212A of the substrate 212. Then, in step 504, a high refractive index material is deposited over the surface 212A to form layer 602, as illustrated in FIG. 6B. The high refractive index material may be, for example, amorphous silicon and this material may be deposited with a plasma enhanced vapor deposition (PEVCD) process. Other materials may be used as long as they have an index of refraction n equal to or larger than 3. In one embodiment, it is possible to use materials having an index of refraction n smaller than 3. Other methods may be used for depositing or growing layer 602 on top of the substrate 212.

Figure 6C:
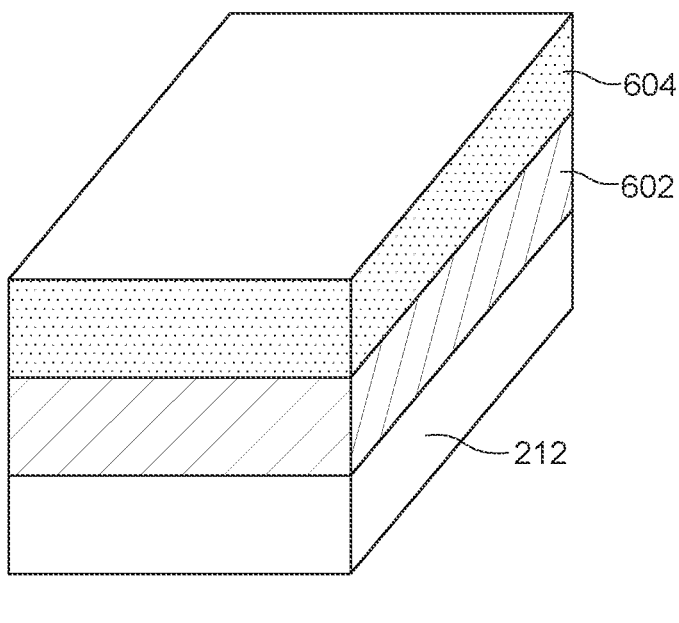
Figure 6D:
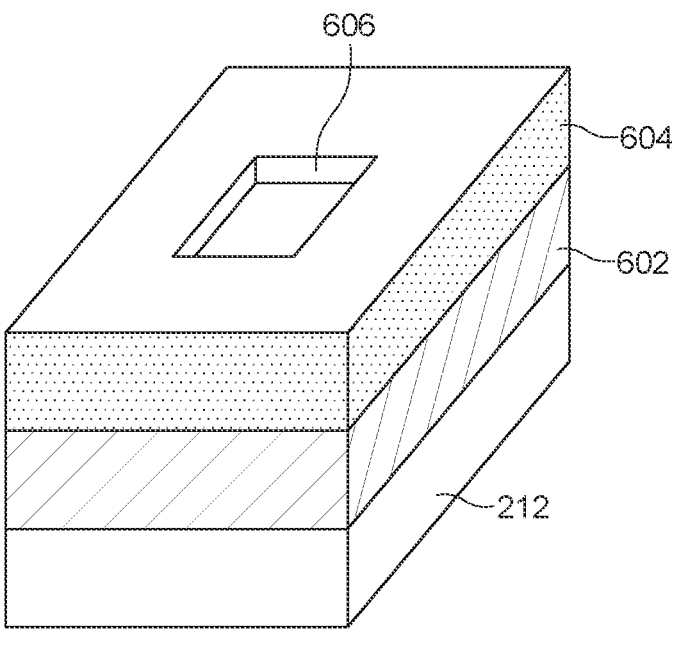

In step 506, a resist layer 604 is deposited on top of the high refractive index layer 602, as illustrated in FIG. 6C. The resist layer 604 may be deposited using spin coating or any other method. In one application, the resist is ZEP520A and it is deposited at a 4,000 rpm. In this application, it is also possible to spin a second resist on top of the first one, and this second resist is a conductive polymer e.g., AR-PC 5090.02, which is deposited also at 4,000 rpm. Then, in step 508, a portion 606 of the resist layer is exposed with electron beam lithography (EBL), or photolithography or other method, as shown in FIG. 6D. The portion is selected to have the length and width the same as the length and width of the desired nano-element to be made. Further, the thickness of the high refractive index layer 602 is selected in step 504 to be the same as the thickness of the desired nano-element to be made. The step of resist exposure may be implemented with electron beam lithography using, for example, an electron beam with a power of about 100 kV and an exposure dose of 210 μC. Other devices and parameters may be used.

Figure 6E:
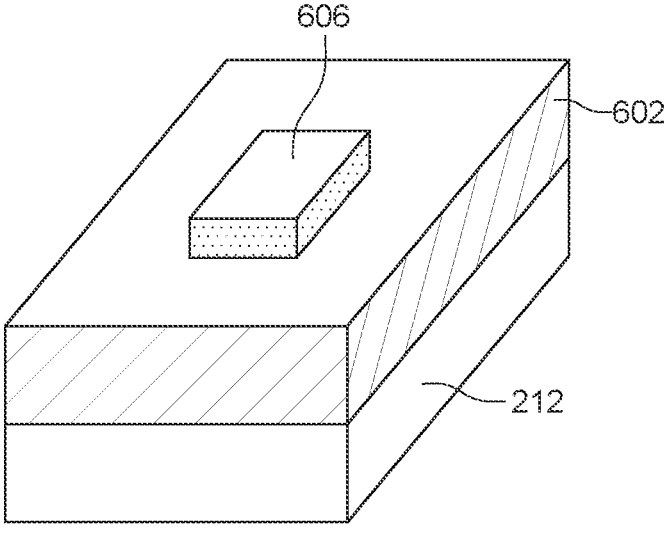
Figure 6F:
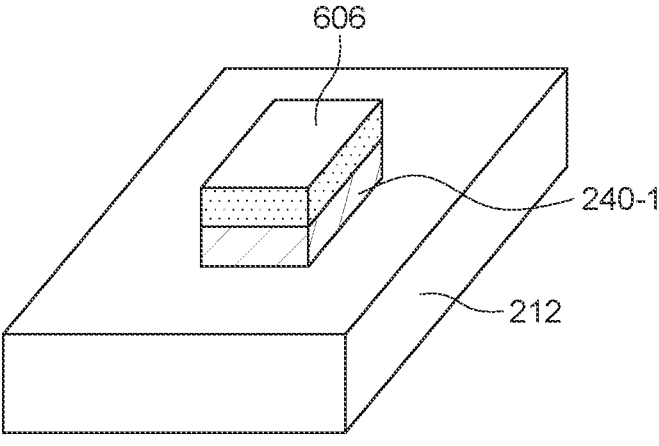
Figure 6G:
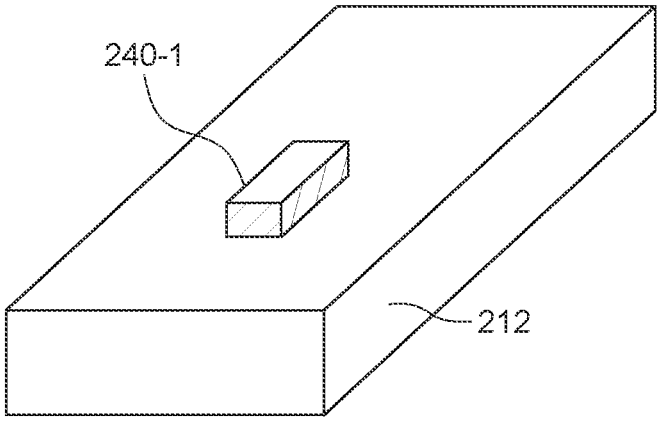

In step 510, the undeveloped resist is removed by a step of resist development so that only the selected portion 606 is left on top of the high refractive index layer 602, as illustrated in FIG. 6E. The step of resist development may be implemented by washing with water for 60 s the probe, then for 90 s with Zed N50, and then for 90 s with Isopropanol. In step 512, the parts of the high refractive index layer 602, which are not protected by the selected portion 606, are removed (see FIG. 6F) by plasma etching or another process, depending on the material used for the high refractive index layer. If the high refractive index layer is made of silicon, then the plasma etching may be performed with $O_2$ and $SF_6$. In step 514, the resist portion 606 is removed, for example, with O2 plasma ashing with reactive ion etching (RIE). Other methods may be used for this step. Then, what is left is only the substrate 212 and the nano-element 240-1, as shown in FIG. 6G.

Figure 6H:
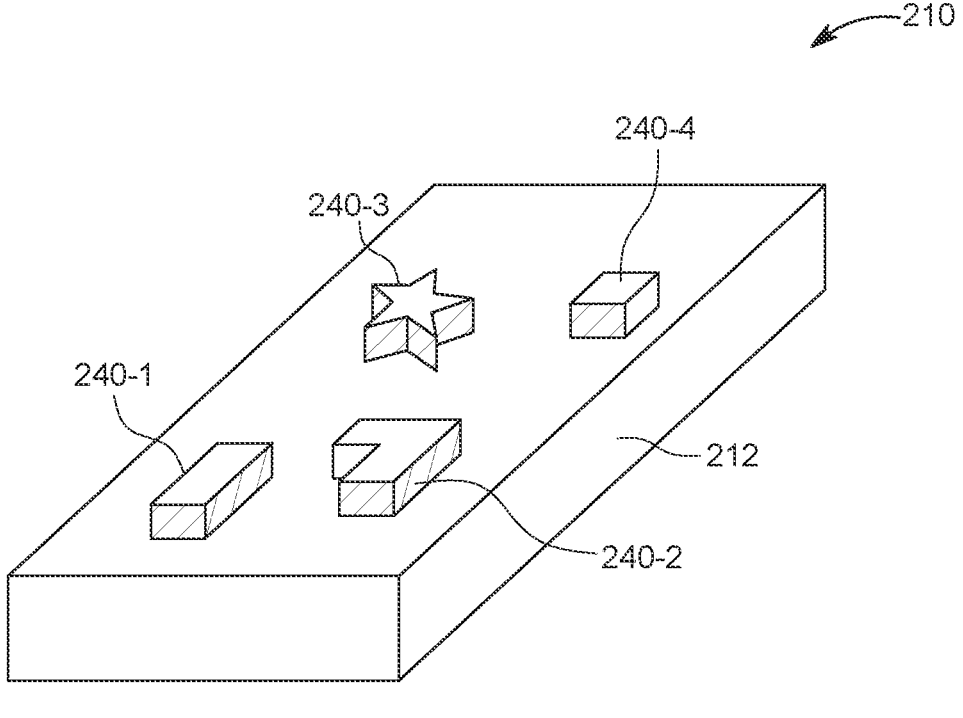

The steps noted above can be repeated a number of times for forming additional nano-elements 240-2 to 240-4, as shown in FIG. 6H. Only four elements are shown in FIG. 6H for simplicity, but more or less nano-elements may be formed. It is noted that the shapes of the nano-elements do not have to be the same. In this regard, FIG. 6H shows all the four nano-elements having different shapes. The number of nano-elements and their shapes is dictated by the desired feature/parameter of the impinging light beam that is desired to be controlled.

FIG. 6H shows the formation of a single layer 210, having the substrate 212 and the plural nano-elements 240i. More such layers may be made and formed in top of each other to obtain the light processing device 200 shown in FIG. 2.

Alternatively, the following method may be used to make the plural nano-elements 240i. A square piece of glass, 18 mm wide and approximately 200 μm thick serves as the substrate for all samples. The substrate is cleaned thoroughly with acetone and isopropyl alcohol, after which a uniform layer of amorphous silicon is deposited via plasma enhanced vapor deposition. The thickness of this layer is controlled to meet the design requirements and verified using spectroscopic ellipsometry. The positive electron beam resist ZEP 520A (ZEON corporation) is then spin coated onto the sample at 4000 RPM for 60 s, after which it is baked on a hot-plate at 180° C. for 3 min. Following this, the conductive polymer AR-PC 5090.02 (ALLRESIST) is spin coated onto the sample at 4000 RPM for 60 s and the device is baked again on a hot-plate for 1 min at 100° C. Pattern writing is achieved using an electron beam lithography system at a 100 kV accelerating voltage. After writing, the sample is submerged in deionized water for 60 s to remove the conductive polymer, developed in n-Amyl acetate for 90 s and cleaned by submersion in isopropyl alcohol for 90 s. Electron beam evaporation is then used to deposit a 22 nm layer of chromium on the sample. A liftoff process is conducted by submerging the sample in N-methylpyrrolidone (ALLRESIST) at 70° C. for one hour and sonicating the solution for one minute afterwards to create a mask. Reactive ion etching with $SF_6$ is then used to remove the unprotected silicon and expose the underlying glass, after which the chromium mask is removed by submersion in a perchloric acid and ceric ammonium nitrate solution for 30 s, yielding the final device.

Figure 7:
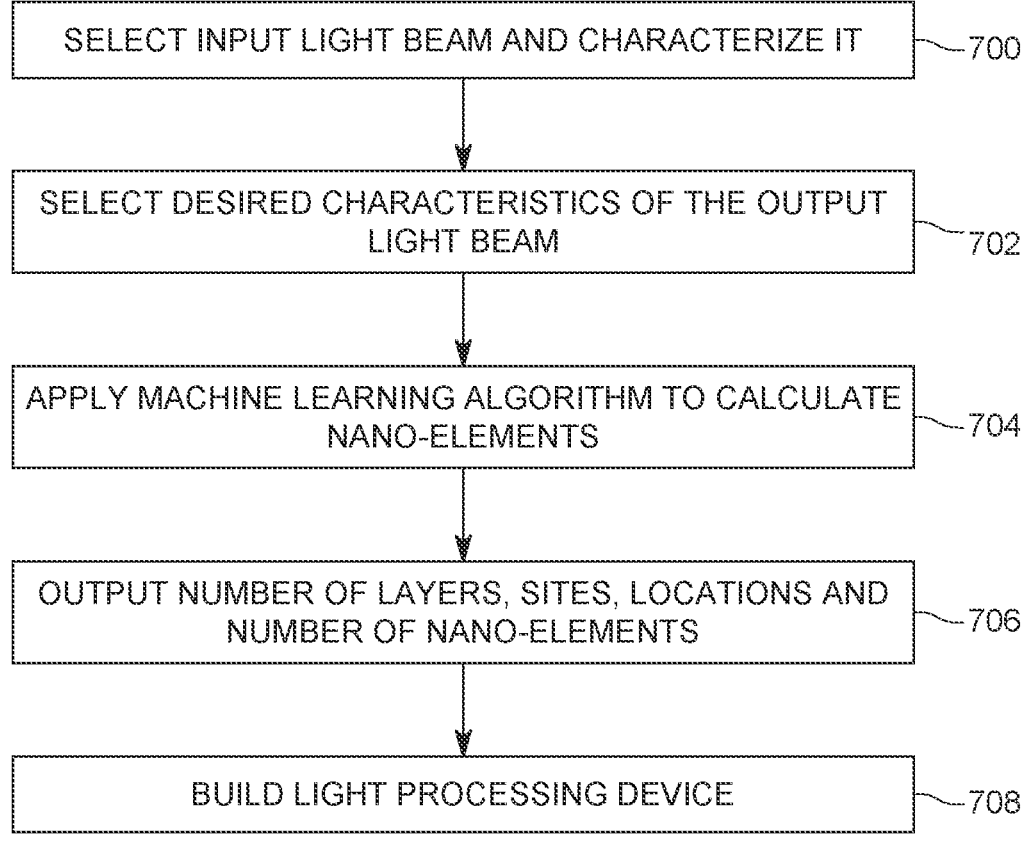
FIG. 7 is a flowchart of a method for determining the structure of a light processing device.

To achieve the desired light processing with the device 200, the following process is employed, which is illustrated in FIG. 7. In step 700, an input light beam is selected and characterized, i.e., its intensity, amplitude, phase, frequency or frequencies is determined. This is the impinging or input light beam that is entering the light processing device 200. Then, in step 702, the properties of the output light beam are selected. In other words, for a practical application, the characteristics of the input light are known and the desired characteristics of the output light beam to be used by a specific application are also known. The properties refer to one or more of the intensity, amplitude, phase, or frequency of the light beam.

Having the input and output properties of the light beams, a mathematical model is applied in step 704 for determining how many layers are necessary for the light processing device 200, how many nano-elements per layer, the size of each nano-element, and the position of each nano-element on the corresponding layer. The mathematical model is implemented with a machine learning algorithm which may be previously trained with simple light beams and single nano-element structures. The model calculates in this step a large number of possibilities of the size and distribution of the nano-elements in the light processing device 200 and then selects a best one, i.e., one that generates the characteristic of the output light beam to be the closest to the desired output light beam. In step 706, the process generates and outputs the number of layers of the light processing device, the number of nano-elements per layer, the size of each nano-element and the location of each nano-element on a corresponding layer. Then, in step 708, the light processing device 200 is manufactured based on the method illustrated in FIG. 5.

Figure 8:
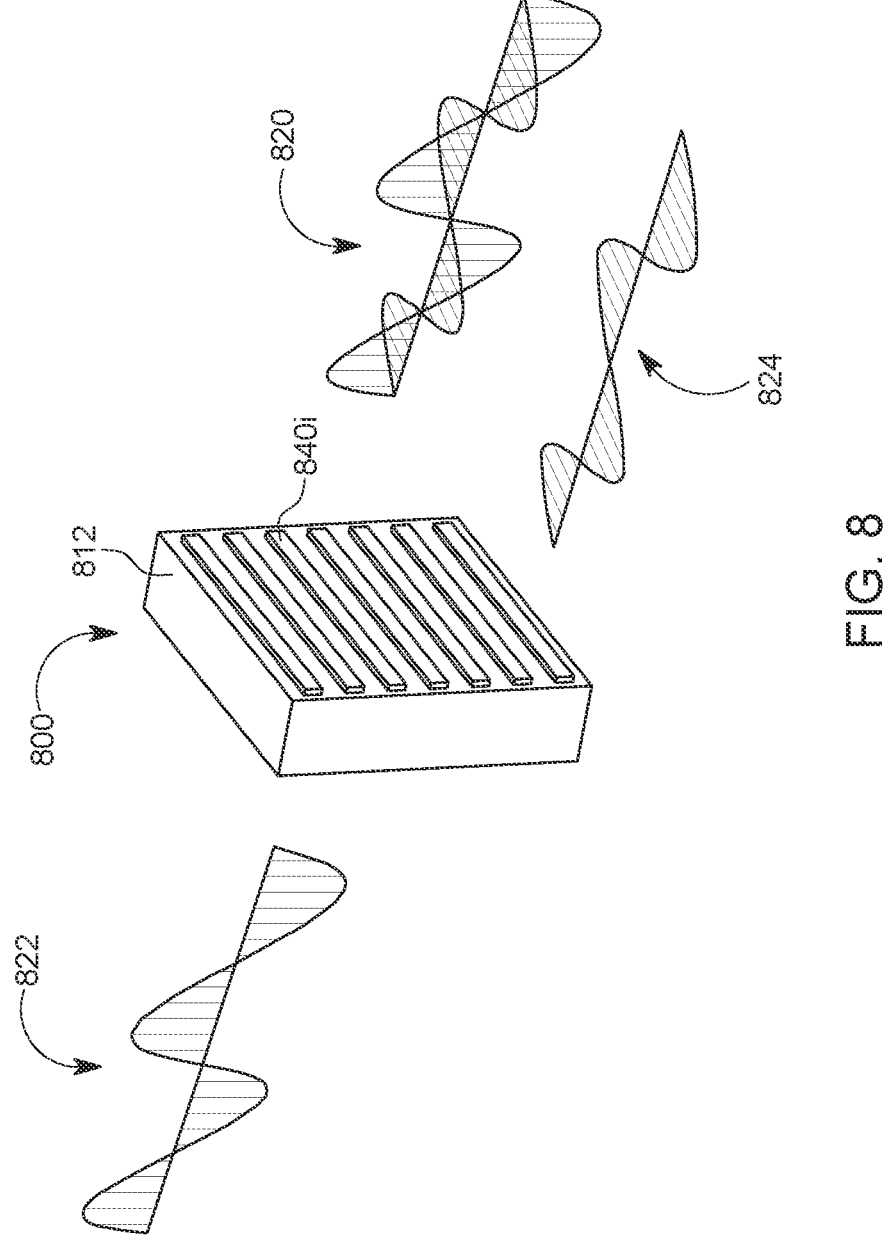
FIG. 8 illustrates a light processing device implemented as a polarizer.

The methods discussed above may be used to generate various practical applications for the light processing device 200. Some of these applications are now discussed. According to the embodiment illustrated in FIG. 8, a polarizing beam splitter 800 includes a substrate 812 and plural nano-elements 840i formed on the substrate. As previously discussed, at least two sides of the nano-elements 840i have sizes (width and depth) in the nano-size domain, i.e., less than 1 μm. FIG. 8 further shows the input light beam 820, which is unpolarized, the transmitted light beam 822, which is vertically polarized, and the reflected light beam 824, which is horizontally polarized. Note that the method discussed with regard to FIG. 7 takes into account the actual characteristics of the input light beam 820 and the desired features of the transmitted light beam 822 when generating the parameters of the light processing device 800, which is a polarizer in this embodiment. However, it is possible that the method of FIG. 7 takes into account the desired features of the reflected light beam 824, or the desired features of both the transmitted light beam 822 and the reflected light beam 824.

Figure 9:
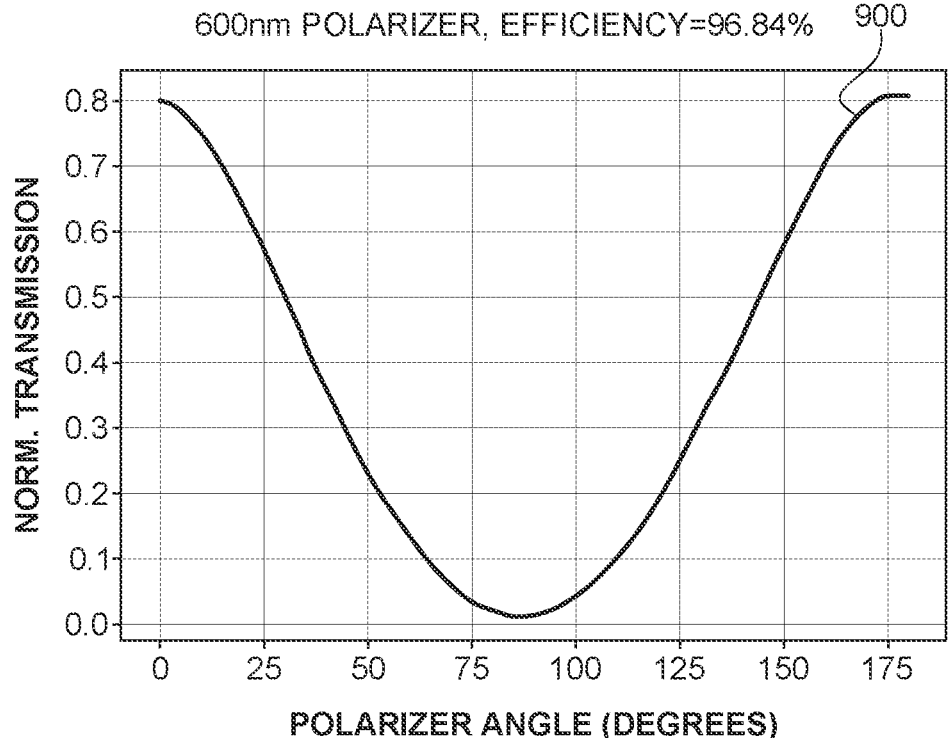
FIG. 9 illustrates a characteristic of an output light beam processed by the polarizer of FIG. 8.

The parameters of the light processing device 800 were determined for an incident light beam 820 having a wavelength of 600 nm. For this specific value, the transmission of the polarizer when plotted versus the polarizer angle, resulted in the graph 900 shown in FIG. 9. The polarizer angle is the angle formed between the polarization generated by the device 800 and the polarization direction of a reference polarization device. The machine learning algorithm used in the method illustrated in FIG. 7 found for this particular implementation that the best structure to achieve this result would be a structure having rectangular strips 840*i* of 55 nm thickness, 117 nm width, and less than 226 nm distance between adjacent strips 840*i* and 840(*i*+1).

Figure 10:
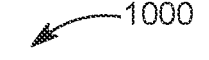
FIG. 10 illustrates a light processing device implemented as a broadband polarizer.
Figure 10:
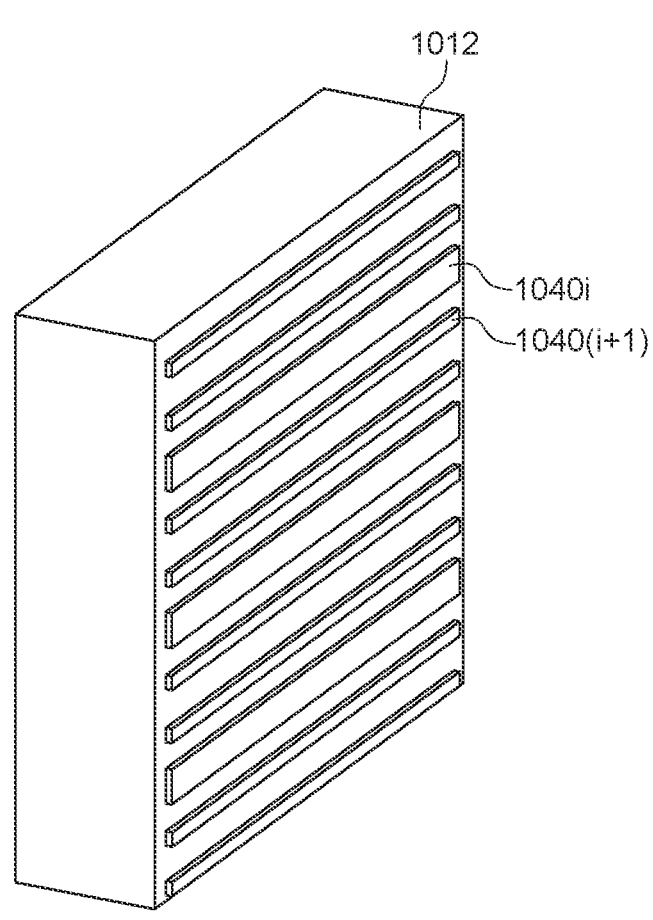
Figure 11:
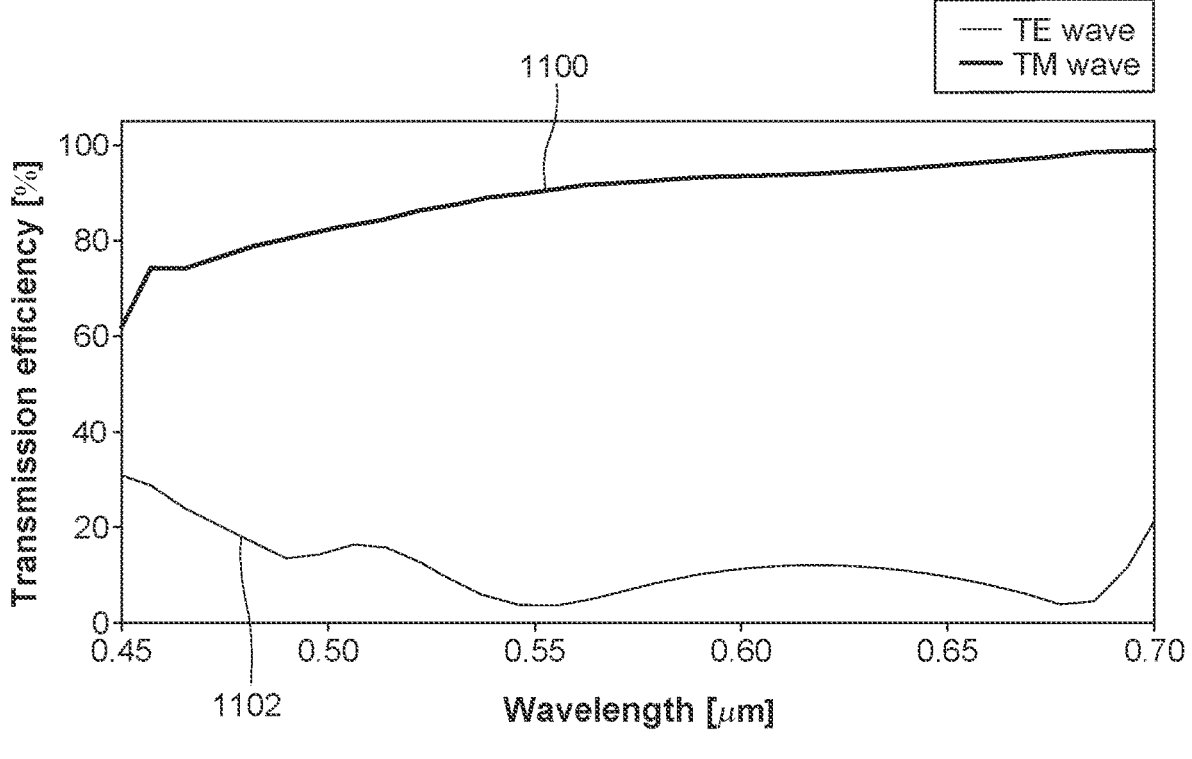
FIG. 11 illustrates a characteristic of an output light beam processed with the broadband polarizer of FIG. 10.

While the light processing device 800 has been optimized (i.e., its parameters were calculated) for a single wavelength of the input light beam, it is possible to design and generate a broadband polarizer 1000, as shown in FIG. 10, which is capable of processing plural wavelengths at the same time. Note that for this case, after applying the method of FIG. 7, plural strips 1040*i* of nano-elements are generated and adjacent nano-elements 1040*i* and 1040(*i*+1) have different widths, but still the same depths. The transmittivity response of the vertically polarized light 1100 and the transmittivity response of the horizontally polarized light 1102 are illustrated in FIG. 11, for different wavelengths. The X axis shows the wavelength of the impinging light and the Y axis shows the intensity of the transmitted light normalized to the intensity of the original beam.

Figure 12:
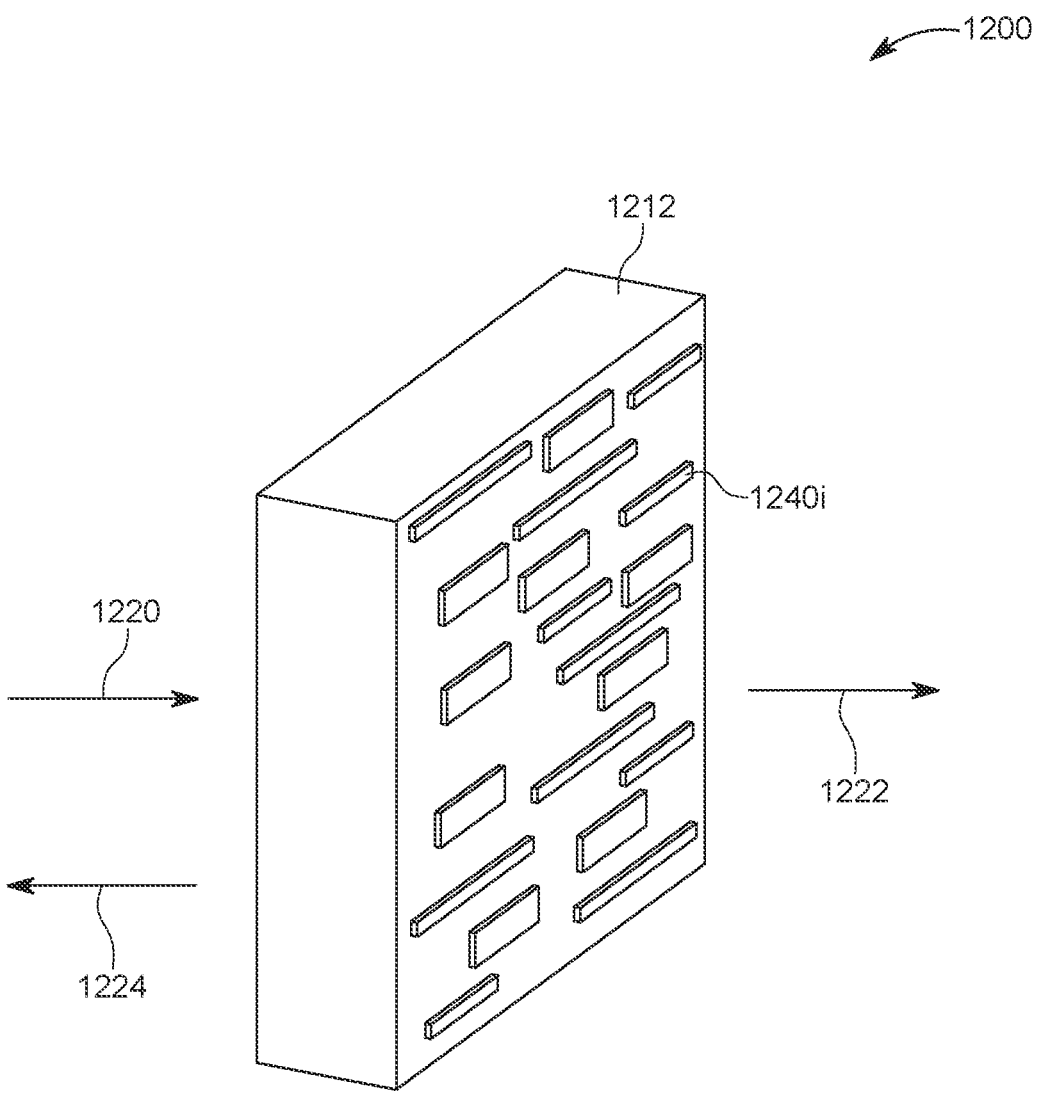
FIG. 12 illustrates a light processing device implemented as a dichroic mirror filter.
Figure 13:
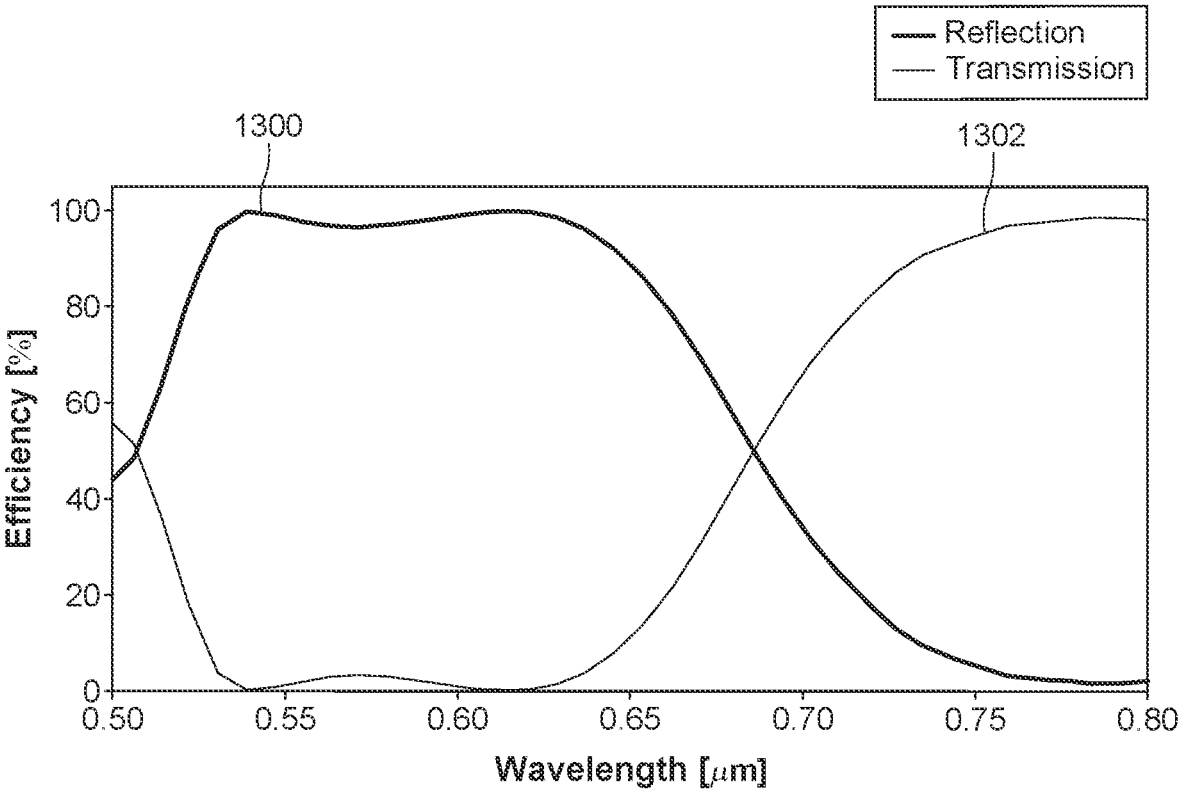
FIG. 13 illustrates a characteristic of an output light beam processed with the dichroic mirror filter of FIG. 12.

FIG. 12 illustrates another implementation of a light processing device 1200 as a dichroic mirror filter. The dichroic mirror filter 1200 is configured to spectrally separate light by transmitting or reflecting light as a function of its wavelength. The dichroic filter 1200 has a substrate 1212 on which various nano-elements 1240*i* are formed. In this case, the plural nano-elements have different shapes and sizes and locations. An incident light beam 1220 includes plural wavelengths, for example, between 500 nm and 900 nm, as illustrated by axis X in FIG. 13. The nano-elements 1240*i* are so distributed and sized on the substrate 1212 so that those wavelengths between 500 nm and about 700 nm are mainly reflected as reflected light beam 1224 (see curve 1300 in FIG. 13) and those wavelengths between 700 nm and 900 are mainly transmitted as transmitted light beam 1222 (see curve 1302 in FIG. 13). In this way, the distribution and sizing of the nano-elements 1240*i* on the substrate 1212 of the light processing device 1200 is capable of separating low wavelengths from high wavelengths, which is desired for various optical applications. The X axis shows the wavelength of the impinging light while the Y axis shows the intensity of transmitted (line 1302) or reflected (line 1300) normalized to the intensity of the impinging beam.

Figure 14:
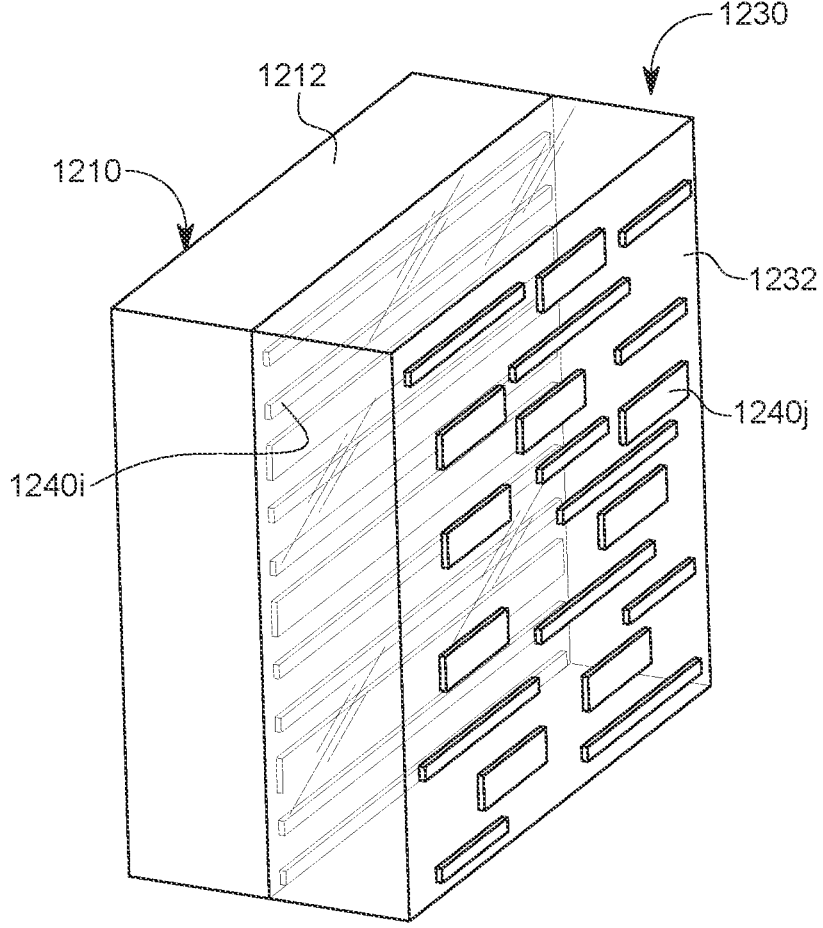
FIG. 14 illustrates a multilayer light processing device that combines a polarizer with a dichroic mirror filter.

The light processing device 1200 may be further modified by adding additional layers of nano-elements 1240*j*, as shown in FIG. 14. In this embodiment the light processing device includes a first layer 1210 and a second layer 1230.

The first layer 1210 includes the substrate 1212 and a first plurality of nano-elements 1240*i*, while the second layer 1230 includes a corresponding substrate 1232 and a second plurality of nano-elements 1240*j*. Such a structure may combine the functionality of single layer devices as previously discussed, thus obtaining a broadband polarizer dichroic filter that may be used for various applications (e.g., illumination, thin film measurements, polarization spectroscopy of gasses, ellipsometry, computer displays, quantum cryptography, etc.). Those skilled in the art would understand that many other applications of the light processing devices discussed herein may be imagined and depending on the one or more characteristics of the output light that needs to be obtained after the light passes such a device, the number of layers of the device, the number of nano-elements, their sizes and positions in the layers may then be calculated using the machine learning algorithm. In one application, the machine learning algorithm uses one or more neural networks for modeling the characteristics of the output light as the input light interacts with the various nano-elements.

Figure 15:
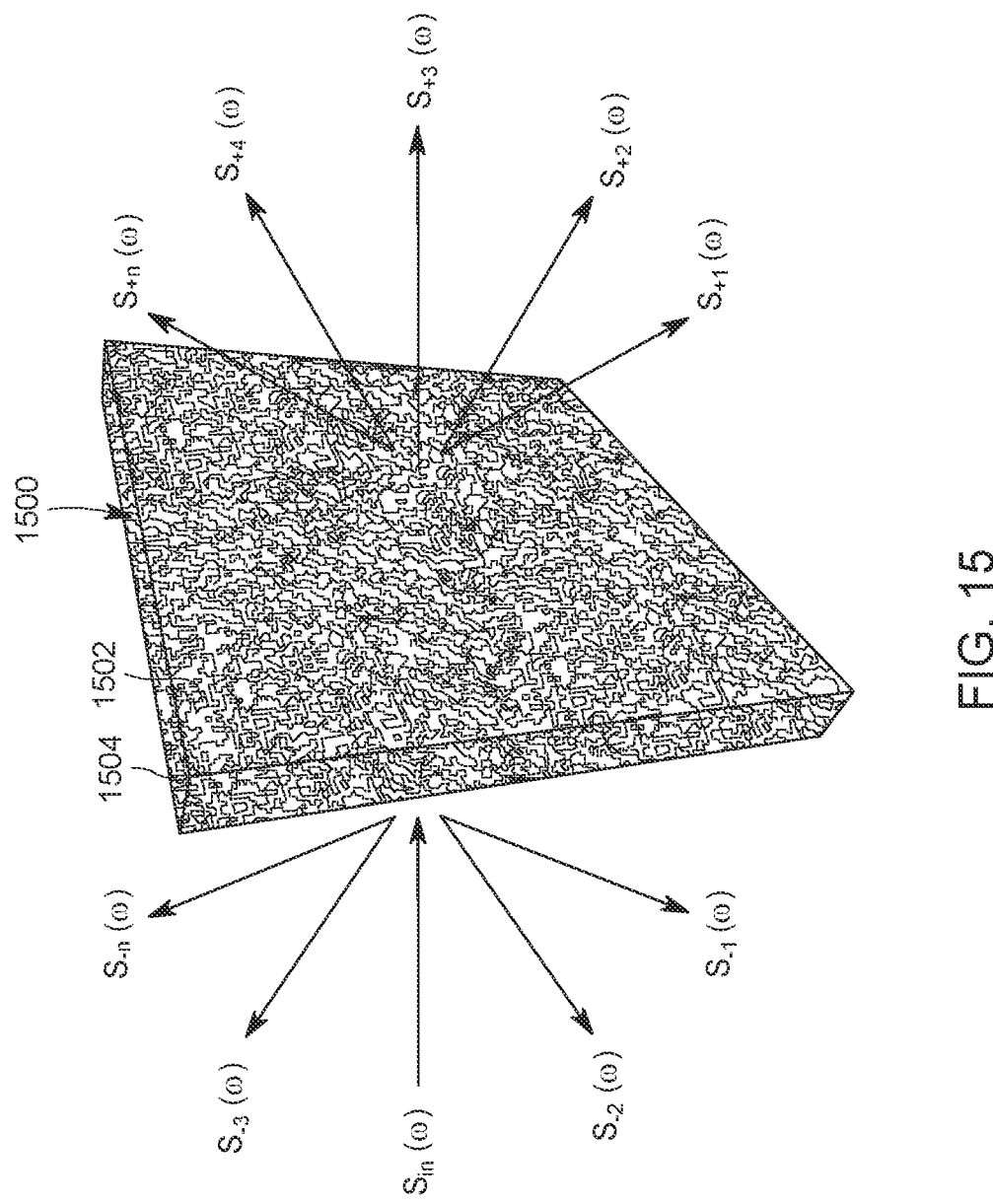
FIG. 15 illustrates a multilayer light processing device, an impinging ray, and various light rays being generated as a result of the impinging ray interacting with the device.

More details about design rules for generating ultra-flat optics with a universal response, as introduced above with regard to the method of FIG. 7, are now discussed. A physical structure 1500 is shown in FIG. 15 and is composed by an optical surface made by ultra-thin (with thicknesses <100 nm) resonant nanostructures 1502 growth on a transparent substrate 1504. The nanostructures 1502 are manufactured with high refractive index semiconductors in complex shapes, obtained from the combination of elementary cuboid geometries. Although other shapes can also be considered, in this embodiment only box structures were used for their fabrication versatility. An impinging electromagnetic wave $s_{in}(\omega)$ impinges on the structure 1500 and generates both reflected $s_{-n}(\omega)$ and $s_{+n}(\omega)$ transmitted contributions in different scattering channels, as illustrated in FIG. 15. Each channel is represented as a wave of amplitude $s_{\pm}$ propagating in a different direction in the space. The system output response $s_{out}(\omega)=[s_{-1}, \ldots, s_{-n}, s_{+1}, \ldots, s_{+n}]$ is composed by the vector containing all the scattered contributions emanating from the surface of the structure 1500. Within this representation, the inverse problem sought to solve is formulated as follows: given an input electromagnetic wave with defined spectrum $s_{in}(\omega)$ and given a desired optical output $s_{out}$ composed of a specific scattering spectrum of waves $s_{\pm}$ propagating along various desired directions with desired amplitudes and phases, design the configuration of the resonant nanostructures that provide the required input-output relationship. In this inverse formulation, this embodiment aims to control the entire scattering from the system, including not only the amplitude and phase of the emission, such as in traditional meta-optics, but also the shape of the wavefront (e.g., completely flat) emanating from the structure.

Figure 16:
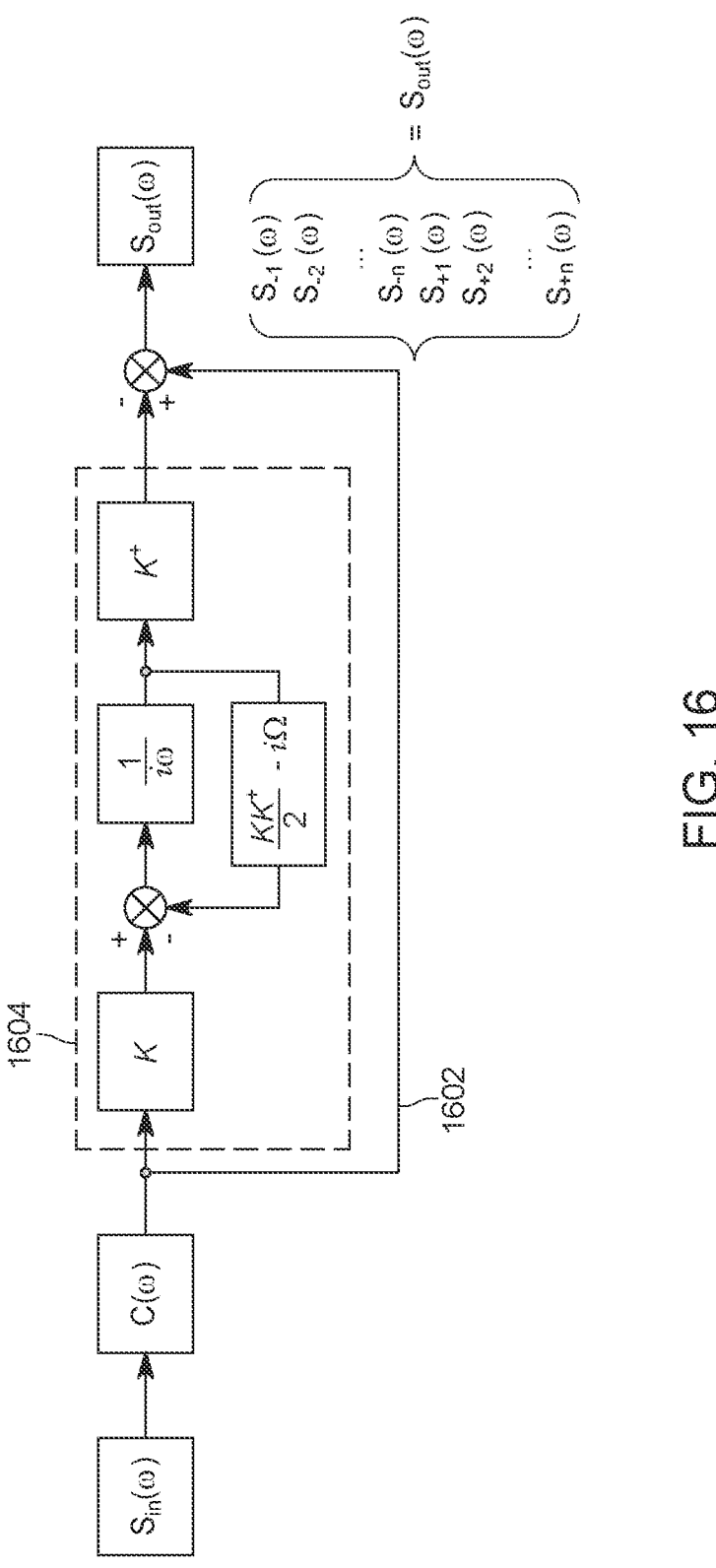
FIG. 16 illustrates a block diagram representation of the input-output relationship of the device illustrated in FIG. 15.

To study the feasibility of this problem, this embodiment investigates the conditions for the structure 1500 in order to generate an arbitrary defined response, and how to control it. FIG. 16 shows a block diagram representation of the input-output relationship of the system, obtained by scattering theory from generalized Maxwell's equations. This approach is based on an intuitive division of the space into propagation and resonant effects, providing an equivalent formulation of Maxwell's equations with a simple set of equations that are fully exact. In this representation, the space is partitioned into two main sets: the union of all resonant nanostructures (resonances space) and the remaining outer space composing the external environment (scattering space). Each nanostructure 1502 is seen from the outer space as an ideal, perfect, electric conductor (PEC) material possessing no resonance. The outer space is seen from each resonant nanostructure as a perfect magnetic conducting (PMC) material.

An advantage of this approach is the use of fully orthogonal and easy to compute modes existing in spaces terminated by ideal boundary conditions (PEC or PMC), and analytically known for many resonator geometries (cubic, spherical, cylindrical, . . . ) from the classical electromagnetic theory. The n-th mode existing in a resonant nanostructure is represented by a resonant frequency $\omega_n$, losses $\gamma_n = \sqrt{\Gamma_{nn}}$, and couplings coefficients $\Gamma_{nm}$, with the other $m \neq n$ modes. The resonant frequencies, losses and couplings of all resonant structures are expressed by a diagonal matrix $\Omega_{nn} = \omega_n$ of resonances, and a damping matrix $\Gamma = KK^\dagger/2$, defined by couplings $K$ with the external environment for energy conservation.

The complete dynamics of light results from the superposition of scattering and resonant effects is represented as follows:

$$s_{out} = C \cdot s_{in} - CK^\dagger [i(\omega - \Omega) + \Gamma]^{-1} K \cdot s_{in}. \tag{1}$$

Equation (1) is composed of two parts: a first part that describes the scattering $C(\omega)$ of the non-resonant structures, and a second part that describes the contribution $K^\dagger [i(\omega - \Omega) + \Gamma]^{-1} K$ from the internal resonant modes of each resonator geometry. The non-resonant contribution forms an open loop response 1602, as illustrated in FIG. 16, and represents the contribution of the propagation effects with no interaction with resonances. The contribution from the resonances is represented by a feedback network 1604, with a negative feedback loop regulated by the damping matrix $\Gamma$ and the mode frequencies $\omega_n$.

From the perspective of the control theory, the model representation illustrated in FIG. 16 suggests that resonance effects are more advantageous for controlling the system output rather than the propagation effects. The latter, in fact, are based on an open loop circuit, and it is well known that this is more unstable and difficult to control than a negative feedback system.

For an optical surface composed of M resonances 1502, equation (1) shows that the input-output response is represented by an analytic rational function with polynomials of order M at the numerator and denominator. Under these conditions, it is possible by controlling 2M resonant frequencies $\omega_m$ (m=1, . . . , 2M) of the modes, to set the output amplitude and phase of the system response exactly at M different frequencies $\omega$, and in the least-square sense at more than M points, in any desired scattering channel. The problem is formulated as a linear regression that can be solved with any of the many techniques available.

Figure 17A:
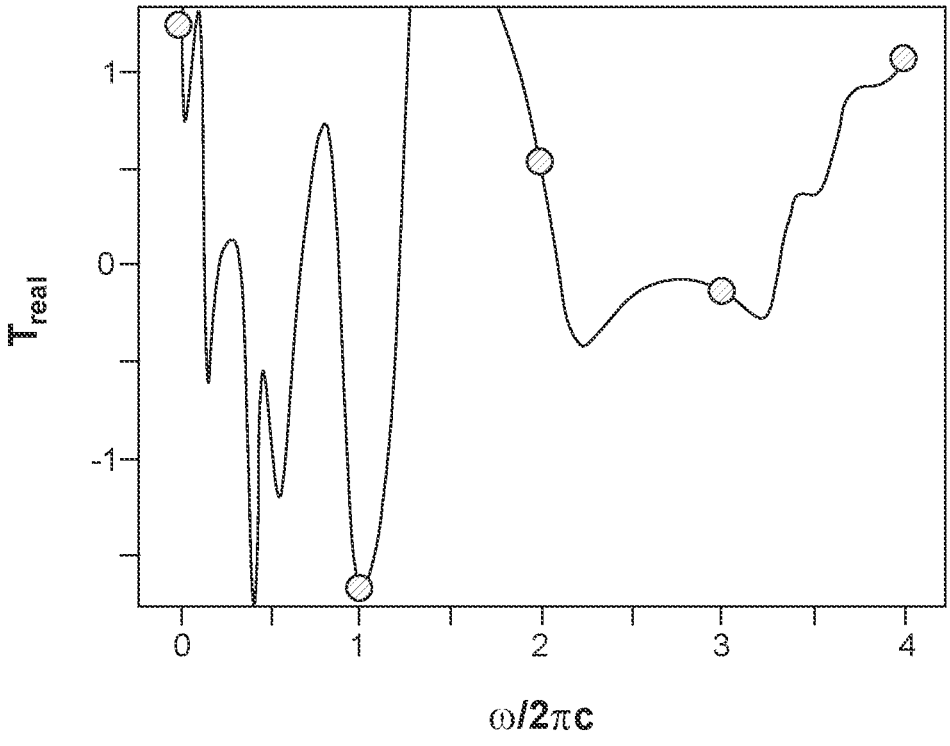
FIGS. 17A to 17D illustrate a cost function model applied to the device of FIG. 15 for determining the shape and sized of the nano-elements placed on the device.
Figure 17B:
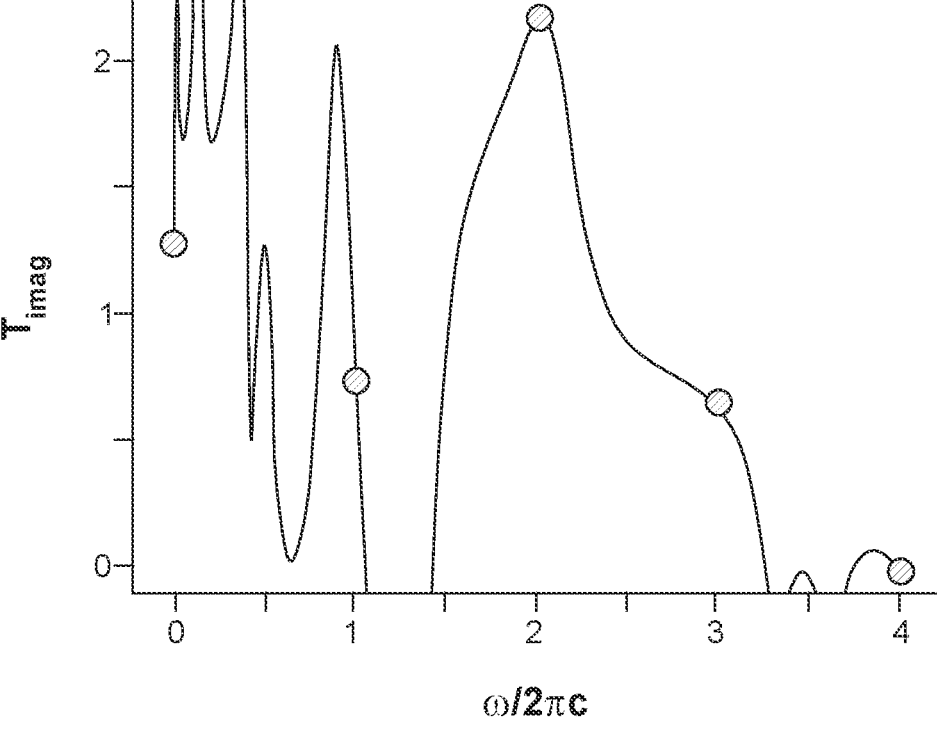
Figure 17C:
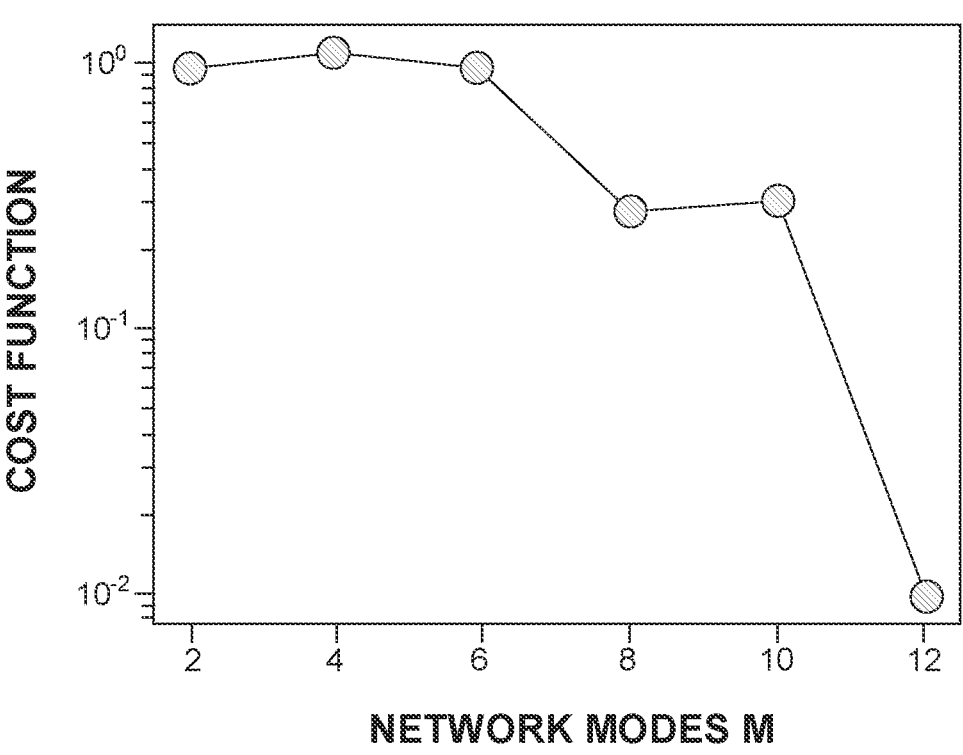
Figure 17D:
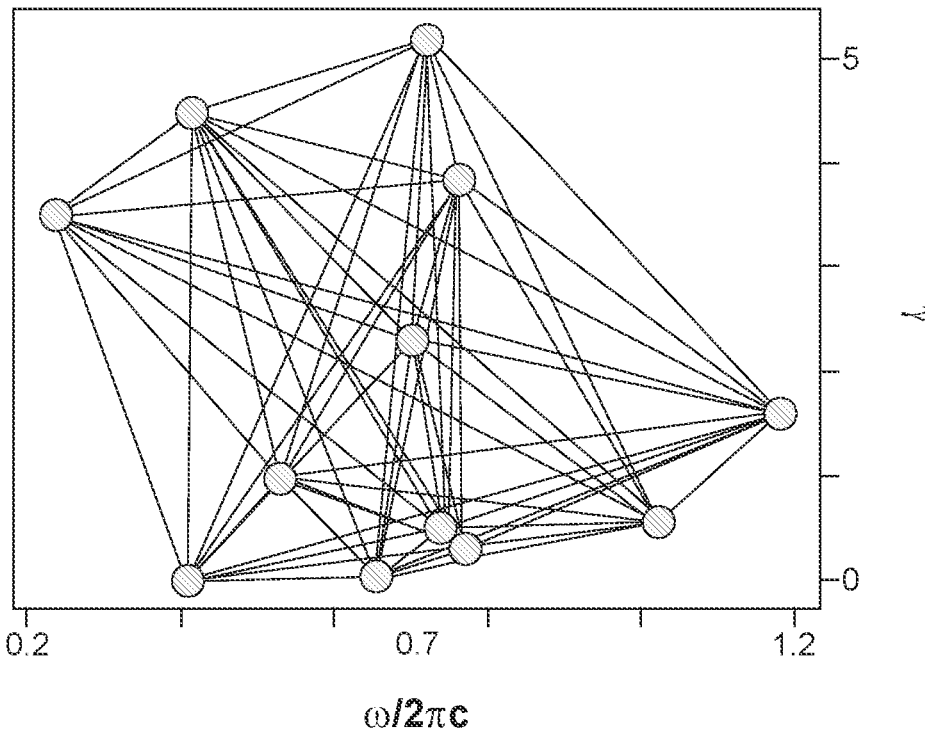

FIGS. 17A to 17D quantitatively illustrate this point with an example. Consider an optical network with N=10 output scattering channels, initialized with random scattering $C = e^{iH}$, with H being a random symmetric matrix, and random couplings $K = A + iB$, with A and B being random matrices. The real and imaginary parts of the output transmission $s_{+1}^{(target)} = T_{real} + iT_{imag}$ of one channel are randomly set at M=5 different spectral points as shown in FIGS. 17A and 17B by the solid points. By using a particle swarm optimization, it is possible to calculate the value of the resonant frequencies $\omega_n$ of the network that minimize the cost function $F = \|s_{+1}^{(target)} - s_{+1}^{(predicted)}\|$, with $s_{+1}^{(predicted)}$ being the output generated by the optical network with a distribution of the resonant frequencies $\omega_n$. In the optimization procedure, only the value of $\omega_n$ was changed, without altering K, damping matrix $\Gamma$ and C. FIG. 17C shows the value of the cost function as a function of the network nodes M and FIG. 17D shows the value of the cost function for the best network obtained as the number of modes M increases.

Once the mode number becomes larger than 2M, the network can represent the desired response. FIG. 17D visualizes the optimized network with M=12 modes, which represents the target response. The network is shown as a connected graph, with nodes representing single resonances in the space $(\omega, \gamma_n)$, and links between nodes n and m representing the modes coupling strength $\Gamma_{nm}$.

For a cuboid resonator of homogeneous refractive index $n_{ref}$ and dimensions $L_x$, $L_y$, $L_z$ terminated by PMC boundary conditions, the resonant frequencies $\omega_{nmp}$ are given by:

$$\omega_{nmp} = \frac{c}{n_{ref}} \sqrt{\left(\frac{n \cdot \pi}{L_x}\right)^2 + \left(\frac{m \cdot \pi}{L_y}\right)^2 + \left(\frac{p \cdot \pi}{L_z}\right)^2}, \tag{2}$$

and can be adjusted by acting on the resonator dimensions $L_x$, $L_y$, and $L_z$. It was found that the number of resonances at visible wavelengths between 300 nm to 800 nm, contained in a cuboid resonator of thickness $L_z = 50$ nm with variable dimensions $L_x$ and $L_y$, ranging from 50 nm to 500 nm, is up to 250. The subwavelength resonators contain hundreds of resonances in the visible spectrum. This indicates that by employing ultra-thin resonators, there is a large number of available resonances to engineer input-output responses that can arbitrarily defined in a broad range of spectral frequencies.

A difficulty in engineering the above technique is the fact that in a dielectric resonator, all resonant frequencies are connected together, as illustrated by equation (2). Modifying the geometry of the system to change the frequency of one resonance inevitably modifies the position of all the others frequencies. The search is then to be developed globally, for the whole set of the resonances in the network. To tackle this problem, the inventors developed an Autonomous Learning Framework for Rule-based Evolutionary Design (AL-FRED). ALFRED consists of two main parts: an optimizer algorithm 1800 and a predictor algorithm 1830, which are symbolically illustrated in FIG. 18.

The global search for the best configuration of resonances is carried out by a swarm particle optimizer algorithm 1800, which is very effective in high-dimensional global optimizations. The swarm optimizer algorithm performs a collective search based on an ensemble of randomly defined tentative particle solutions, with each particle (a bee 1802 that moves through a previously visited point 1804, a global best visited point 1806, and a personal best visited point 1808) representing a specific geometry of boxes resonators that can solve the problem. The particles 1802 randomly explore the multidimensional phase space of solutions by using three main components, the knowledge arising from the single particle exploration (memory), the knowledge gained by the other particles (social), and the particle search speed (inertia). These values are updated at each step until the minimum of a suitably defined cost function that defines the problem is found. As in the example of FIG. 17A, a cost function is defined as the norm between the desired response and the predicted one from the particle under consideration. The swarm converges to the geometry configuration that minimizes this function with the structure that represents the desired response.

The algorithm developed in this embodiment is a parallel version of the adaptive swarm optimizer, in which the search parameters (inertia, social, and memory) of each particle are evaluated at each step based on their collective interactions. In this implementation, each particle evolution is carried out by a CPU-core of a supercomputer architecture, and particle interactions are carried out in time between different cores, thus considerably speeding up the entire global optimization routine.

The main bottleneck of this optimizer algorithm 1800 is the time required for each particle 1802 to evaluate the value of the cost function. In this computation, each particle 1802 needs to calculate the output response from the structure by using first principle simulations carried out by finite difference time domain (FDTD) codes. The use of FDTD is necessary to take into account all comprehensive material effects (e.g., dispersion, . . . ) that can furnish an accurate design structure. In this embodiment, tens of different degrees of freedom are optimized and the resulting FDTD time is quite substantial.

Figure 18:
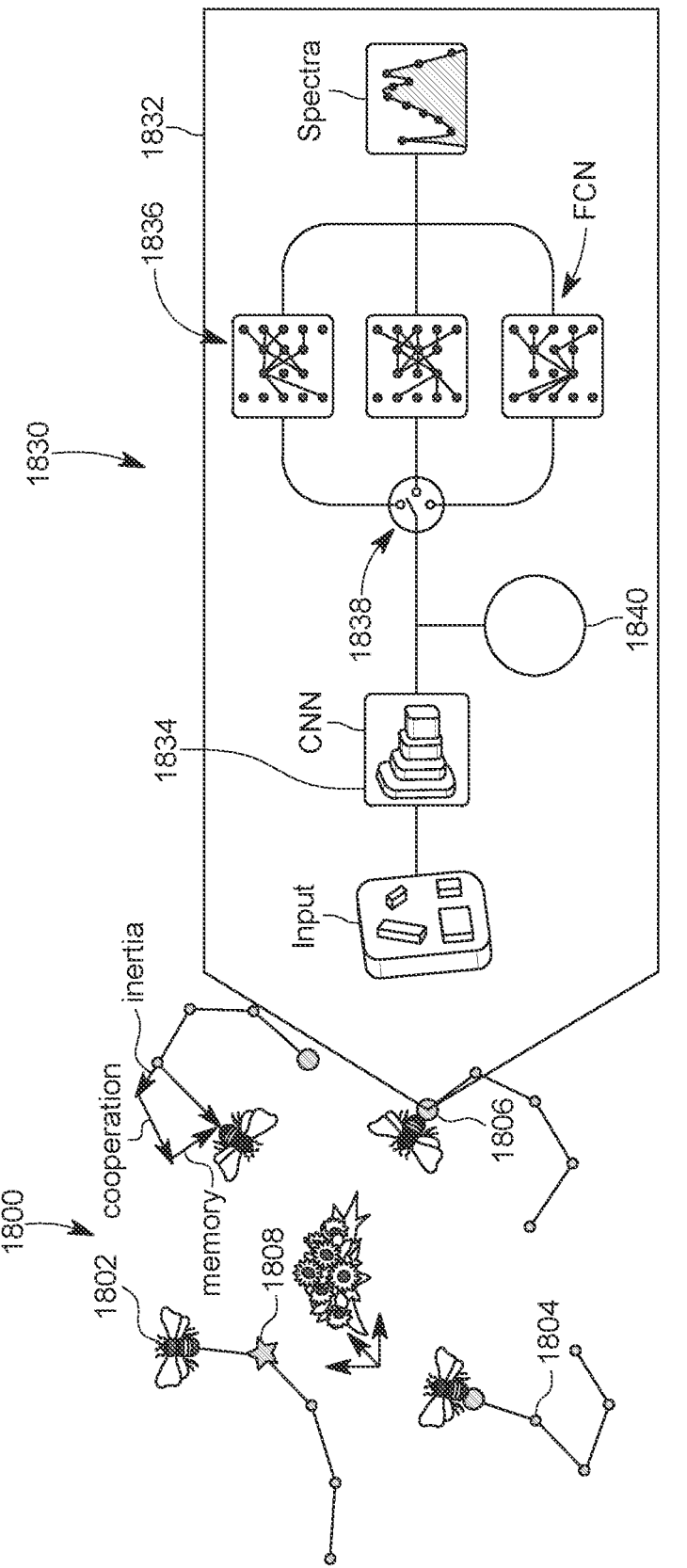
FIG. 18 illustrates an Autonomous Learning Framework for Rule-based Evolutionary Design algorithm having an optimizer module and a predictor module.

For this reason, a neural network predictor module 1832 was developed in this embodiment and it was attached to each particle 1802, (see FIG. 18). The neural network predictor module 1832 predicts the outcome of the FDTD simulations by deep learning. The predictor is based on a convolutional neural network (CNN) 1834 based on a Res-Net18 inspired architecture that operates on an image representing a single cell of the structure. The CNN 1834 extracts multidimensional features from the image and feeds them to a second block 1836 composed of fully connected neural networks (FCNN), which predict the output spectral response of the system. A non-trainable switch 1838 is used to include information about the thickness of the structure (i.e., the features of the system, which are represented by block 1840). Different FCN were trained with discrete thicknesses in the range from 50 to 300 nm with a step of 25 nm. Then, the FCNs are connected sequentially to the output from the CNN block 1834, through the logical switch 1838, which is designed to choose the appropriate FCN block for the given input material thickness. Because the goal of this embodiment is to create flat optics framework, when all structural elements have the same thickness, creating different logical parts of a model for different thicknesses turns out to be the most efficient approach.

The training dataset is automatically generated by ALFRED in the background and continuously optimized to produce better predictions. The latter step is accomplished by mapping the current dataset into a suitably defined multidimensional feature space and generating additional datasets in the regions where the predictions are lower than a predetermined threshold (80%). The prediction of ALFRED matches the FDTD computations very well in a large spectral region for both TE and TM input polarizations. Thus, for the reasonably low threshold level at 0.01 mean squared error, more than 99% of the predictions on a training dataset are considered as being valid.

In a typical optimization problem, the swarm with the CNN+FCN blocks is used first and a high number of particles to quickly converge to an initial predicted structure that solves the problem. Once this solution is found, the method removes the predictor layer and launches a second global optimization, with a less number of particles employing the swarm with standard FDTD simulations on an ensemble of particles around the found solution to generate an exact design.

The disclosed embodiments provide a light processing device that is capable of controlling one or more parameters of an input light beam so that an output light beam has a desired feature. It should be understood that this description is not intended to limit the invention. On the contrary, the exemplary embodiments are intended to cover alternatives, modifications and equivalents, which are included in the spirit and scope of the invention as defined by the appended claims. Further, in the detailed description of the exemplary embodiments, numerous specific details are set forth in order to provide a comprehensive understanding of the claimed invention. However, one skilled in the art would understand that various embodiments may be practiced without such specific details.

Although the features and elements of the present embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A light processing device comprising:
a first layer having a substrate; and
plural nano-elements formed on the substrate,
wherein a feature of the plural nano-elements is selected to control a parameter of an input light beam that impinges of the first layer so that a first wavelength range of the input light beam is reflected and a second wavelength range of the input light beam is transmitted, and
wherein wavelengths in the second wavelength range are larger than wavelengths in the first wavelength range.

2. The device of claim 1, wherein the substrate is glass and the plural nano-elements are made of silicon.

3. The device of claim 1, wherein a nano-element of the plural nano-elements has at least two sides smaller than 1 μm.

4. The device of claim 3, wherein all sides of the nano-element are smaller than 1 μm.

5. The device of claim 1, wherein each of the plural nano-elements has at least one side smaller than 1 μm.

6. The device of claim 1, wherein the parameter of the input light beam is a wavelength.

7. The device of claim 1, wherein the parameter of the input light beam is an amplitude.

8. The device of claim 1, wherein the parameter of the input light beam is a phase.

9. The device of claim 1, wherein the feature is a position of the nano-elements on the substrate.

10. The device of claim 1, wherein the feature is a size of the nano-elements.

11. The device of claim 1, wherein the feature is a number of the nano-elements on the substrate.

12. The device of claim 1, wherein the feature is a position of the nano-elements on the substrate, a size of each nano-element, and a number of the nano-elements on the substrate.

13. The device of claim 1, further comprising:
a second layer formed over the first layer, and the second layer having another plurality of nano-elements.

14. The device of claim 1, wherein the device is a dichroic mirror filter that separates the second wavelength range from the first wavelength range.

15. The device of claim 1, wherein the substrate is made of a material having an index of refraction equal to or smaller than 2 and the plural nano-elements are made of a material having an index of refraction equal to or larger than 3.

16. A method for configuring a light processing device for processing an input light beam, the method comprising:

receiving characteristics of the input light beam;

selecting desired values for characteristics of first and second output light beams, wherein the first output light beam is a result of the input light beam being reflected by the light processing device, and the second output light beam is a result of the input light beam passing through the light processing device;

applying a machine learning algorithm to the characteristics of the input light beam and to the desired values of the first and second output light beams to determine a parameter of nano-elements associated with the light processing device; and building the light processing device based on the determined parameter, wherein the first output light beam corresponds to a first wavelength range and the second output light beam corresponds to a second wavelength range, and wherein wavelengths in the second wavelength range are larger than wavelengths in the first wavelength range.

17. The method of claim 16, wherein the parameter is one of a number of layers of the light processing device, a number of nano-elements per layer, a size of the nano-elements, or a location of the nano-element on the corresponding layer.

18. The method of claim 16, wherein the parameter includes a number of layers of the light processing device, a number of nano-elements, a size of the nano-elements, and a location of the nano-element on a corresponding layer.

19. A light processing device comprising:

a first layer having a substrate; and plural nano-elements formed on the substrate, at least two nano-element of the plural nano-elements having a feature that is different from each other, wherein the feature of the plural nano-elements is selected to control a parameter of an input light beam that impinges of the first layer so that a first wavelength range of the input light beam is reflected and a second wavelength range of the input light beam is transmitted, and wherein wavelengths in the second wavelength range are larger than wavelengths in the first wavelength range.

\* \* \* \* \*